United States Patent
Lee et al.

(10) Patent No.: US 10,193,059 B2
(45) Date of Patent: Jan. 29, 2019

(54) PERPENDICULARLY MAGNETIZED SPIN-ORBIT MAGNETIC DEVICE

(71) Applicant: Industrial Technology Research Institute, Hsinchu (TW)

(72) Inventors: Hsin-Han Lee, Taipei (TW); Shan-Yi Yang, Hsinchu (TW); Yu-Sheng Chen, Taoyuan (TW); Yao-Jen Chang, Yulin County (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 15/358,157

(22) Filed: Nov. 22, 2016

(65) Prior Publication Data
US 2018/0040811 A1    Feb. 8, 2018

(30) Foreign Application Priority Data
Aug. 4, 2016   (TW) .............................. 105124742 A

(51) Int. Cl.
*H01L 43/08* (2006.01)
*G11C 11/16* (2006.01)
(Continued)

(52) U.S. Cl.
CPC ............ *H01L 43/08* (2013.01); *G11C 11/161* (2013.01); *G11C 11/18* (2013.01); *H01L 43/02* (2013.01); *H01L 43/10* (2013.01)

(58) Field of Classification Search
CPC ......... H01L 43/08; H01L 43/10; H01L 43/02; H01L 27/228; G11C 11/161
See application file for complete search history.

(56) References Cited

U.S. PATENT DOCUMENTS

| | | | |
|---|---|---|---|
| 8,889,433 B2 | 11/2014 | De Brosse et al. | |
| 8,963,222 B2 | 2/2015 | Guo | |
| 9,076,537 B2 | 7/2015 | Khvalkovskiy et al. | |
| 2007/0063236 A1* | 3/2007 | Huai ..................... | B82Y 25/00 257/295 |
| 2007/0171694 A1* | 7/2007 | Huai ..................... | H01L 43/08 365/145 |

(Continued)

FOREIGN PATENT DOCUMENTS

| | | |
|---|---|---|
| CN | 105390609 | 3/2016 |
| TW | 201409788 | 3/2014 |
| TW | 201543478 | 11/2015 |

OTHER PUBLICATIONS

Yu et al., "Switching of perpendicular magnetization by spin-orbit torques in the absence of external magnetic fields", Nature Nanotech., Jul. 2014, pp. 548-554.
Fukami et al., "Magnetization switching by spin-orbit torque in an antiferromagnet-ferromagnet bilayer system", Nature Materials, May 2016, pp. 535-542.

(Continued)

*Primary Examiner* — Thanh Y Tran
(74) *Attorney, Agent, or Firm* — JCIPRNET

(57) ABSTRACT

A perpendicularly magnetized spin-orbit magnetic device including a heavy metal layer, a magnetic tunnel junction, a first antiferromagnetic layer, a first block layer and a first stray field applying layer is provided. The magnetic tunnel junction is disposed on the heavy metal layer. The first block layer is disposed between the magnetic tunnel junction and the first antiferromagnetic layer. The first stray field applying layer is disposed between the first antiferromagnetic layer and the first block layer. The first stray field applying layer provides a stray magnetic field parallel to a film plane. The first antiferromagnetic layer contacts the first stray field (Continued)

applying layer to define the direction of the magnetic moment in the first stray field applying layer.

10 Claims, 10 Drawing Sheets

(51) Int. Cl.
*H01L 43/02* (2006.01)
*H01L 43/10* (2006.01)
*G11C 11/18* (2006.01)

(56) References Cited

U.S. PATENT DOCUMENTS

| 2014/0056060 | A1 | 2/2014 | Khvalkovskiy et al. | |
|---|---|---|---|---|
| 2014/0056061 | A1* | 2/2014 | Khvalkovskiy | H01L 43/02 365/158 |
| 2014/0169088 | A1 | 6/2014 | Buhrman et al. | |
| 2014/0269035 | A1 | 9/2014 | Manipatrumi et al. | |
| 2014/0312441 | A1 | 10/2014 | Guo | |
| 2015/0200003 | A1 | 7/2015 | Buhrman et al. | |

OTHER PUBLICATIONS

Manipatruni et al. "Energy-delay performance of giant spin Hall effect switching for dense magnetic memory", Applied Physics Express, Sep. 19, 2014, pp. 103001-1-103001-4.
Miron et al., "Perpendicular switching of a single ferromagnetic layer induced by in-plane current injection", Nature, Aug. 11, 2011, pp. 189-194.
Liu et al., "Current-Induced Switching of Perpendicularly Magnetized Magnetic Layers Using Spin Torque from the Spin Hall Effect", Aug. 31, 2012, pp. 096602-1-096602-5.
Lee et al., "Threshold current for switching of a perpendicular magnetic layer induced by spin Hall effect", Appl. Phys. Lett., Mar. 20, 2013, pp. 112410-1-112410-5.
Liu et al., "Spin-Torque Switching with the Giant Spin Hall Effect of Tantalum", Science, May 4, 2012, pp. 555-559.
"Office Action of Taiwan Counterpart Application," dated Jun. 21, 2017, p. 1-p. 5.

* cited by examiner

PERPENDICULARLY MAGNETIZED SPIN-ORBIT MAGNETIC DEVICE

CROSS-REFERENCE TO RELATED APPLICATION

This application claims the priority benefit of Taiwan application serial no. 105124742, filed on Aug. 4, 2016. The entirety of the above-mentioned patent application is hereby incorporated by reference herein and made a part of this specification.

BACKGROUND OF THE DISCLOSURE

Field of the Disclosure

The disclosure relates to a perpendicularly magnetized spin-orbit magnetic device.

Description of Related Art

Magnetic random access memory (MRAM) has advantages of fast speed, low power consumption, high density, non-volatile, and has almost unlimited read and write times, and is predicted as a mainstream of memories coming in the next generation. A main structure of a memory device in the MRAM is a stacked structure formed by stacking a pinned layer of three-layer materials with ferromagnet/non-magnetic metal/ferromagnet, a tunneling barrier layer and a free layer of a magnetic material. Such stacked structure can be referred to as a magnetic tunnel junction (MTJ) device. Since a write current only flows through the selected MTJ device, and magnetic switching is determined by an intensity of the write current and an intensity of an external magnetic field, it avails decreasing the write current after the MTJ device is miniaturized, and effects of simultaneously improving write selectivity and decreasing the write current are theoretically achieved.

The MTJ devices using a spin-orbit-torque (SOT) mechanism to implement read and write operations can be divided into in-plan MTJ devices and perpendicular MTJ devices. Compared to the in-plan MTJ device, the perpendicular MTJ device has a lower operating current, a higher device density and better data storability. A perpendicular spin torque transfer random access memory (pSTT-RAM) is regarded as a memory of the new generation, which records digital information of 0 and 1 through spin transfer switching, and takes the perpendicular MTJ as a main magnetic memory cell structure, which has good thermal stability, and an operating current thereof is smaller compared with that of the other type of the magnetic memory.

If the SOT mechanism is adopted to implement the MRAM structure, an operating speed and write reliability can be further improved. A switching mechanism of the SOT in a perpendicular film plane magnetic torque is to introduce the write current to a heavy metal layer. The heavy metal layer may produce a spin transfer torque (STT) based on a spin Hall effect and the external magnetic field. Moreover, the write current may produce a Rashba torque (RT) after passing through a perpendicular electric field at a material interface and the external magnetic field. Since the STT and the RT are all perpendicular to a direction of the write current and parallel to the film plane, the two torques are added to form the SOT. Therefore, if a magnetic field is applied to the ferromagnetic material on the film plane that is perpendicular to the magnetic torque, the SOT is produced to switch the magnetic torque of the ferromagnetic layer to achieve an effect of writing the memory device. However, the above mechanism requires to additionally input the write current and apply the external magnetic field. Manufacturers hope to simplify design complexity of an operation mechanism used for controlling the magnetic memory cell structure in case that the SOT mechanism is used as a mechanism for reading and writing the magnetic memory cells.

SUMMARY OF THE DISCLOSURE

The disclosure is directed to a magnetic spin switching memory cell structure, which is adapted to spontaneously provide a magnetic field to a free layer in a magnetic tunnel junction, so as to provide a switching effect to a magnetic moment in the memory cell structure when an input current is input as that does of an external magnetic field.

The disclosure provides a perpendicularly magnetized spin-orbit magnetic device including a heavy metal layer, a magnetic tunnel junction, a first antiferromagnetic layer, a first block layer and a first stray field applying layer. The magnetic tunnel junction is disposed on the heavy metal layer. The first block layer is disposed between the magnetic tunnel junction and the first antiferromagnetic layer. The first stray field applying layer is disposed between the first antiferromagnetic layer and the first block layer. The first stray field applying layer provides a stray magnetic field parallel to a film plane. The first antiferromagnetic layer contacts the first stray field applying layer to define a direction of a magnetic moment in the first stray field applying layer.

According to the above description, the perpendicularly magnetized spin-orbit magnetic device may spontaneously produce a stray closed magnetic circle to a free layer in the magnetic tunnel junction to provide the stray magnetic field through the antiferromagnetic layer, the block layer and the stray field applying layer, so as to provide a switching effect to a magnetic moment in the memory cell structure when an input current is input as that does of an external magnetic field. In this way, operation complexity of the perpendicularly magnetized spin-orbit magnetic device is simplified. Since the perpendicularly magnetized spin-orbit magnetic device itself may produce the stray magnetic field without using the external magnetic field, and magnetic moment switching of the free layer of the magnetic tunnel junction in the perpendicularly magnetized spin-orbit magnetic device can be implemented only by introducing the input current, the design complexity of the operation mechanism used for controlling the perpendicularly magnetized spin-orbit magnetic device can be greatly simplified.

In order to make the aforementioned and other features and advantages of the disclosure comprehensible, several exemplary embodiments accompanied with figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF EMBODIMENTS

Figure 1:
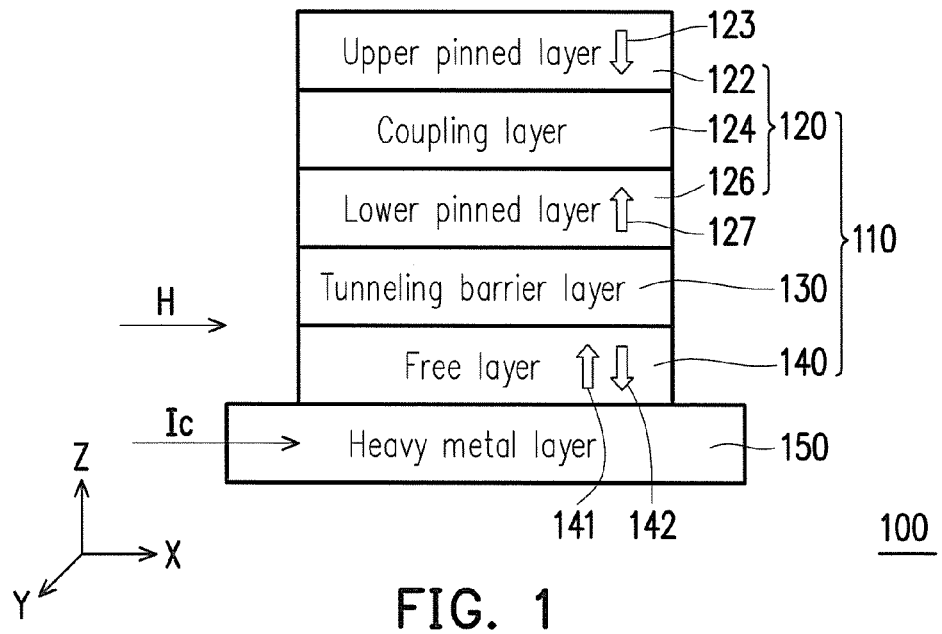
FIG. 1 is a cross-sectional view of a structure of a perpendicularly magnetized spin-orbit magnetic device.

FIG. 1 is a cross-sectional view of a structure of a perpendicularly magnetized spin-orbit magnetic device 100. The perpendicularly magnetized spin-orbit magnetic device 100 mainly includes a magnetic tunnel junction 110 and a heavy metal layer 150. In the present embodiment, the magnetic tunnel junction 110 includes a pinned layer 120, a tunneling barrier layer 130 and a free layer 140. The pinned layer 120 is, for example, a material stacking layer of ferromagnet/non-magnetic metal/ferromagnet consisting of a lower pinned layer 126, a coupling layer 124 and an upper pinned layer 122. A magnetic moment vector 123 of the upper pinned layer 122 and a magnetic moment vector 127 of the lower pinned layer 126 are opposite to each other and perpendicular to a film plane to present a vertical coupling arrangement without being changed by an operating magnetic field or other factors.

The pinned layer 120 is disposed on the tunneling barrier layer 130. The tunneling barrier layer 130 can be disposed on the free layer 140. The free layer 140 is a memory layer in the perpendicularly magnetized spin-orbit magnetic device 100. The heavy metal layer 150 may receive an input current Ic from an electrode contact of the perpendicularly magnetized spin-orbit magnetic device 100. Moreover, the input current Ic may flow through the heavy metal layer 150 to produce a plurality of spin currents with different directions due to a spin Hall effect (SHE), so as to produce a resultant moment together with an external magnetic field H, such that a magnetic moment of the free layer 140 is switched to achieve a data read/write effect.

In order to facilitate description, coordinate axes X, Y, Z are set in the figures of the embodiments of the disclosure to facilitate subsequent description. An X-axis direction is an extending direction of the film plane, a Y-axis direction is an upward direction perpendicular to a paper surface, and a Z-axis direction is a direction perpendicular to the film plane. The film plane of each layer is parallel to an XY plane, and arrows 127, 141 used for representing magnetic moment directions of magnetic moment vectors belong to the positive Z-axis direction, and arrows 123, 142 belong to the negative Z-axis direction, and the others are deduced by analogy. In the present embodiment, a provided direction of the external magnetic field H and a transfer direction of the input current Ic belong to the positive X-axis direction.

The perpendicularly magnetized spin-orbit magnetic device 100 in FIG. 1 still adopts the input current Ic input from external and the external magnetic field H in order to achieve the data read/write operation. For example, when the input current Ic is a positive value and the external magnetic field H is applied, a direction of a spin transfer torque induced by the free layer 140 is upward and perpendicular to the paper surface (i.e. the positive Y-axis direction), such that the direction of the magnetic moment in the free layer 140 is changed from the arrow 141 into the arrow 142. Comparatively, when the input current Ic is a negative value (i.e. a flow direction of the input current Ic is a reverse direction) and the external magnetic field H is applied, the direction of the spin transfer torque induced by the free layer 140 is downward and perpendicular to the paper surface (i.e. the negative Y-axis direction), such that the direction of the magnetic moment in the free layer 140 is changed from the arrow 142 into the arrow 141. However, if the external magnetic field H is not applied, the spin transfer torque is not generated.

The embodiment of the disclosure provides a perpendicularly magnetized spin-orbit magnetic device, in which an antiferromagnetic layer, a block layer and a stray field applying layer are additionally added to generate a stray magnetic field, so as to produce a situation the same with that of the external magnetic field to the free layer of the magnetic tunnel junction, and provide a magnetic moment switching effect to the perpendicularly magnetized spin-orbit magnetic device when the input current is input. Embodiments are provided below to describe the spirit of the disclosure in detail, though the disclosure is not limited to the provided embodiment, and the embodiments can also be suitably combined.

Figure 2:
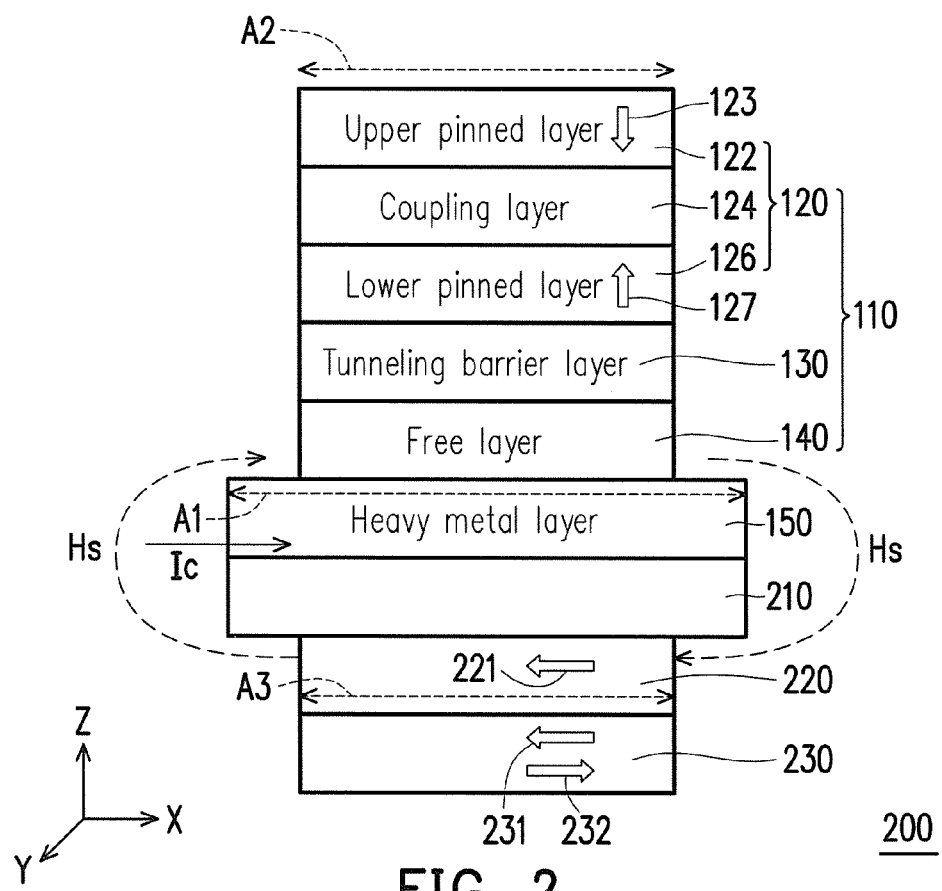
FIG. 2 is a cross-sectional view of a structure of a perpendicularly magnetized spin-orbit magnetic device according to a first embodiment of the disclosure.

FIG. 2 is a cross-sectional view of a structure of a perpendicularly magnetized spin-orbit magnetic device 200 according to a first embodiment of the disclosure. A material of the upper pinned layer 122 and the lower pinned layer 126 in FIG. 2 can be a ferromagnetic material with perpendicular anisotropy. The upper pinned layer 122 and the lower pinned layer 126 can be a single layer structure or a multi-layer composite structure. The upper pinned layer 122 and the lower pinned layer 126 of the single layer structure are, for example, implemented by ferromagnetic materials of ferrous (Fe), cobalt (Co), nickel (Ni), etc., or an alloy of the above elements. The upper pinned layer 122 and the lower pinned layer 126 of the multi-layer composite structure can be a composite layer structure of a ferromagnetic material and a metal material, for example, a composite layer structure composed of elements such as Co/platinum (Pt), Co/Ni, Co/palladium (Pd), etc. A material of the coupling layer 124 can be Ruthenium (Ru). The tunneling barrier layer 130 is an insulating material having a magnetic tunnel condition under a specified thickness. The insulating materials can be magnesium oxide, aluminium oxide, magnesium, or a combination thereof.

A material of the free layer 140 can be a ferromagnetic material with perpendicular anisotropy. The free layer 140 mainly implements the data read/write operation through switching of the magnetic moment in the magnetic film layer, so that the ferromagnetic material of the free layer 140 can be Fe, Co, Ni, gadlinium (Gd), terbium (Tb), dysprosium (Dy), boron (B) or an alloy of the above elements, for example, CoFeB, NF, FeB, etc. The free layer 140 can be a single layer structure or a multi-layer composite structure. If the free layer is a composite structure formed by multi-layer ferromagnetic materials, the material of the multi-layer composite structure can be a composite structure consisting of elements such as Co/Pt, Co/Ni, Co/Pd, etc. The magnetic moment vector of the free layer 140 is arranged by perpendicular to the film plane. A material of the heavy metal layer 150 can be tantalum (Ta), platinum (Pt), tungsten (W), or a combination thereof.

The perpendicularly magnetized spin-orbit magnetic device 200 of FIG. 2 additionally has a first antiferromagnetic layer 230, a first stray field applying layer 220 and a first block layer 210. The first stray field applying layer 220 is disposed between the first antiferromagnetic layer 230 and the first block layer 210. The first antiferromagnetic layer 230 contacts the first stray field applying layer 220 to define a direction of a magnetic moment in the first stray field applying layer 220 to be parallel to the film plane, as shown by arrows 231 and 232. In detail, in order to ensure that the first antiferromagnetic layer 230 may define the direction of the magnetic moment, the first antiferromagnetic layer 230 is processed with a field annealing treatment of a predetermined temperature, so as to use the first antiferromagnetic layer 230 to fix the direction of the magnetic moment in the first stray field applying layer 220 (for example, the X-axis magnetic moment direction indicated by the arrow 221). The first antiferromagnetic layer 230 can be composed of an antiferromagnetic material, and the antiferromagnetic material can be platinum-manganese alloy (PtMn), magnesium oxide (MnO), iridium-manganese alloy (IrMn), chromium oxide (CrO), or a combination thereof.

In other words, the first stray field applying layer 220 is influenced by the first antiferromagnetic layer 230 (for example, the magnetic moment directions indicated by the arrows 231, 232) to produce a closed magnetic circle parallel to the film plane and strayed outside the first stray field applying layer 220, so as to produce a stray magnetic field Hs. In the present embodiment, the direction of the magnetic moment in the first stray field applying layer 220 is shown as the arrow 221. The first stray field applying layer 220 can be composed of a ferromagnetic material, and the ferromagnetic material can be Fe, Co, Ni, Gd, Tb, Dy, B or an alloy of the above elements. The first block layer 210 is used for blocking the first antiferromagnetic layer 230 from transferring a magnetic moment arrangement direction, i.e. to avoid the current Ic in the heavy metal layer 150 from being influenced by the first antiferromagnetic layer 230. On the other hand, since a spin current is produced in the heavy metal layer 150, the first block layer 210 is required to block the spin current in the heavy metal layer 150 from influencing the first stray field applying layer 220. The first block layer 210 may have a predetermined thickness obtained through experiments, so as to effectively block transferring of the spin current between the metals or the ferromagnetic materials of the upper and lower layers, such that operation mechanisms of each layer can be pure without influencing each other. A material of the first block layer 210 can be magnesium oxide, aluminium oxide, magnesium, or a combination thereof.

In this way, regarding the free layer 140, the function of the stray magnetic field Hs is the same with that of the external magnetic field H of FIG. 1. In other words, to operate the perpendicularly magnetized spin-orbit magnetic device 200, it is only required to provide the input current Ic to the heavy metal layer 150, and the free layer 140 may implement magnetic moment switching to generate the stray magnetic field Hs, so as to implement the read/write function of the data memorized by the free layer 140 without additionally providing the external magnetic field H. In this way, complexity of the perpendicularly magnetized spin-orbit magnetic device 200 in the read/write operation is simplified.

In the embodiment of the disclosure, the first block layer 210, the first stray field applying layer 220 and the first antiferromagnetic layer 230 are disposed under the heavy metal layer 150. In the present embodiment, the heavy metal layer 150 of FIG. 2 is disposed on the first block layer 210, the first block layer 210 is disposed on the first stray field applying layer 220, and the first stray field applying layer 220 is disposed on the first antiferromagnetic layer 230. In other embodiment complied with the spirit of the disclosure, the first block layer, the first stray field applying layer and the first antiferromagnetic layer can also be disposed above the pinned layer 120 of the magnetic tunnel junction 110.

It should be noted that in the embodiment of the disclosure, shapes of the magnetic tunnel junction 110 and the first stray field applying layer 220 in the perpendicularly magnetized spin-orbit magnetic device 200 and areas of film planes are compared, and data simulation is performed to the stray magnetic field to analyze a shape and an area proportion between the free layer 140 of the magnetic tunnel junction 110 and the magnetic tunnel junction 110 in order to obtain the better stray magnetic field Hs, or being influenced by magnetic fields of other directions. Shapes of the magnetic tunnel junction 110, the heavy metal layer 150, the first block layer 210, the first stray field applying layer 220 or the first antiferromagnetic layer 230 can be rounds, ovals, squares or rectangles.

In the following description, it is assumed that the shapes of the magnetic tunnel junction 110, the heavy metal layer 150, the first block layer 210, the first stray field applying layer 220 and the first antiferromagnetic layer 230 are all rounds, and the shapes of each layer (including the free layer 140) in the magnetic tunnel junction 110 are also rounds. The heavy metal layer 150 has a first film plane area A1 on the XY plane, and the magnetic tunnel junction 110 has a second film plane area A2 on the XY plane. In the present embodiment, the first film plane area A1 is greater than the second film plane area A2. The first stray field applying layer 220 and the first antiferromagnetic layer 230 have a same third film plane area A3 on the XY plane. It should be noted that regarding the free layer 140, a "horizontal direction stray magnetic field Hs" is a magnetic field component of the stray magnetic field Hs parallel to the film plane of the free layer 140 (i.e. parallel to the XY plane), and the horizontal direction stray magnetic field Hs may effectively produce the spin transfer switching effect to the free layer 140. A "vertical direction stray magnetic field Hs" is a magnetic field component of the stray magnetic field Hs perpendicular to the film plane of the free layer 140 (i.e. parallel to the Z-axis direction). The vertical direction stray magnetic field Hs is hard to produce the spin transfer switching effect to the free layer 140, but may interfere the spin transfer switching effect to make the transfer switching effect much worse. When the third film plane area A3 of the first stray field applying layer 220 is the same with the second film plane area A2 of the free layer 140, and the shapes thereof are consistent, through simulations of the stray magnetic field Hs in FIG. 2 to FIG. 5, it is known that the horizontal direction stray magnetic field Hs at a boundary of the free layer 140 of FIG. 2 is larger than the horizontal direction stray magnetic field Hs at the boundary of the free layer 140 in FIG. 3, FIG. 4 and FIG. 5. However, the vertical direction stray magnetic field Hs at the boundary of the free layer 140 of FIG. 2 is also larger than the vertical direction stray magnetic field Hs at the boundary of the free layer 140 in FIG. 3, FIG. 4 and FIG. 5.

Figure 3:
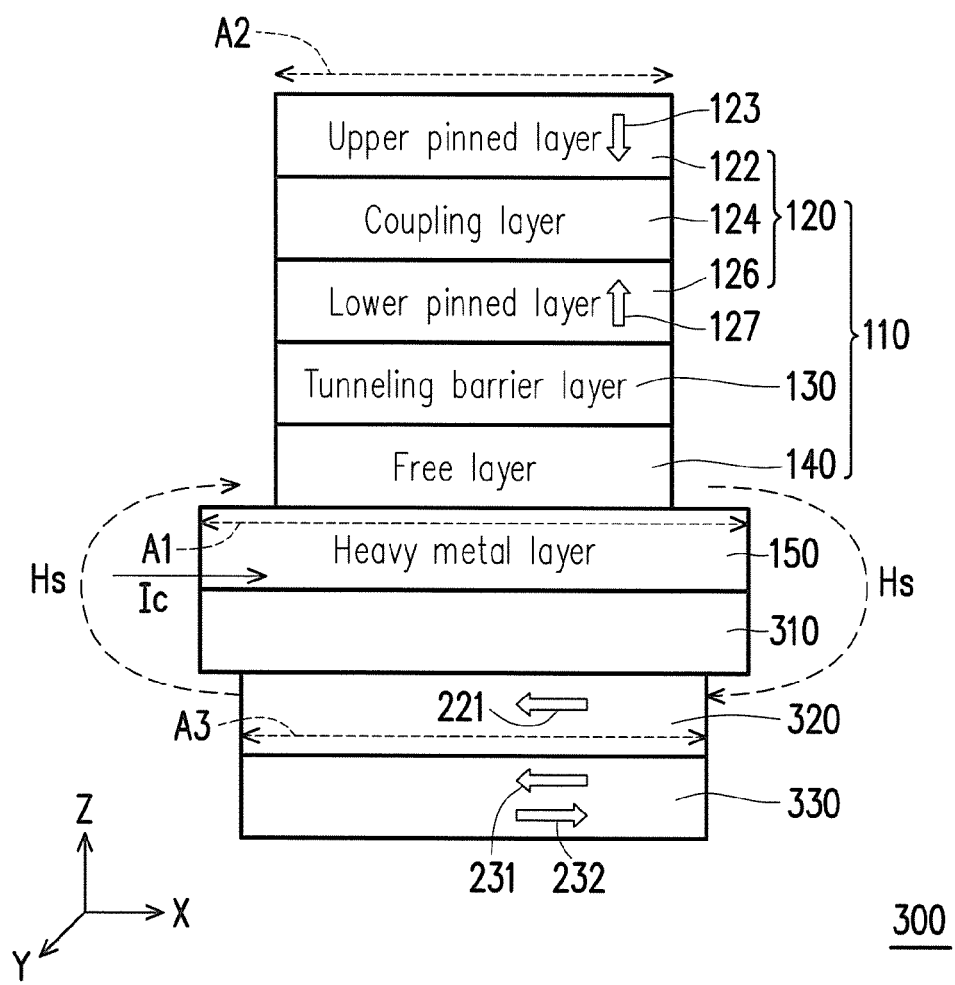
FIG. 3 is a cross-sectional view of a structure of a perpendicularly magnetized spin-orbit magnetic device according to a second embodiment of the disclosure.

FIG. 3 is a cross-sectional view of a structure of a perpendicularly magnetized spin-orbit magnetic device 300 according to a second embodiment of the disclosure. The first antiferromagnetic layer 330 defines a direction of the magnetic moment in the first stray field applying layer 320 to be parallel to the film plane, as shown by arrows 231 and 232. The direction of the magnetic moment in the first stray field applying layer 320 is indicated by the arrow 221. A difference between FIG. 2 and FIG. 3 is that the third film plane area A3 of the first antiferromagnetic layer 330 and the first stray field applying layer 320 is smaller than the first film plane area A1 of the heavy metal layer 150, and the third film plane area A3 is greater than the second film plane area A2 of the magnetic tunnel junction 110. A film plane area of the first block layer 310 is A1. Through simulations of the stray magnetic field Hs in FIG. 2 to FIG. 5, it is known that the horizontal direction stray magnetic field Hs and the vertical direction stray magnetic field Hs at the boundary of the free layer 140 of FIG. 3 are all larger than the horizontal direction stray magnetic field Hs and the vertical direction stray magnetic field Hs at the boundary of the free layer 140 in FIG. 4 and FIG. 5, and are all smaller than the horizontal direction stray magnetic field Hs and the vertical direction stray magnetic field Hs at the boundary of the free layer 140 in FIG. 2.

Figure 4A:
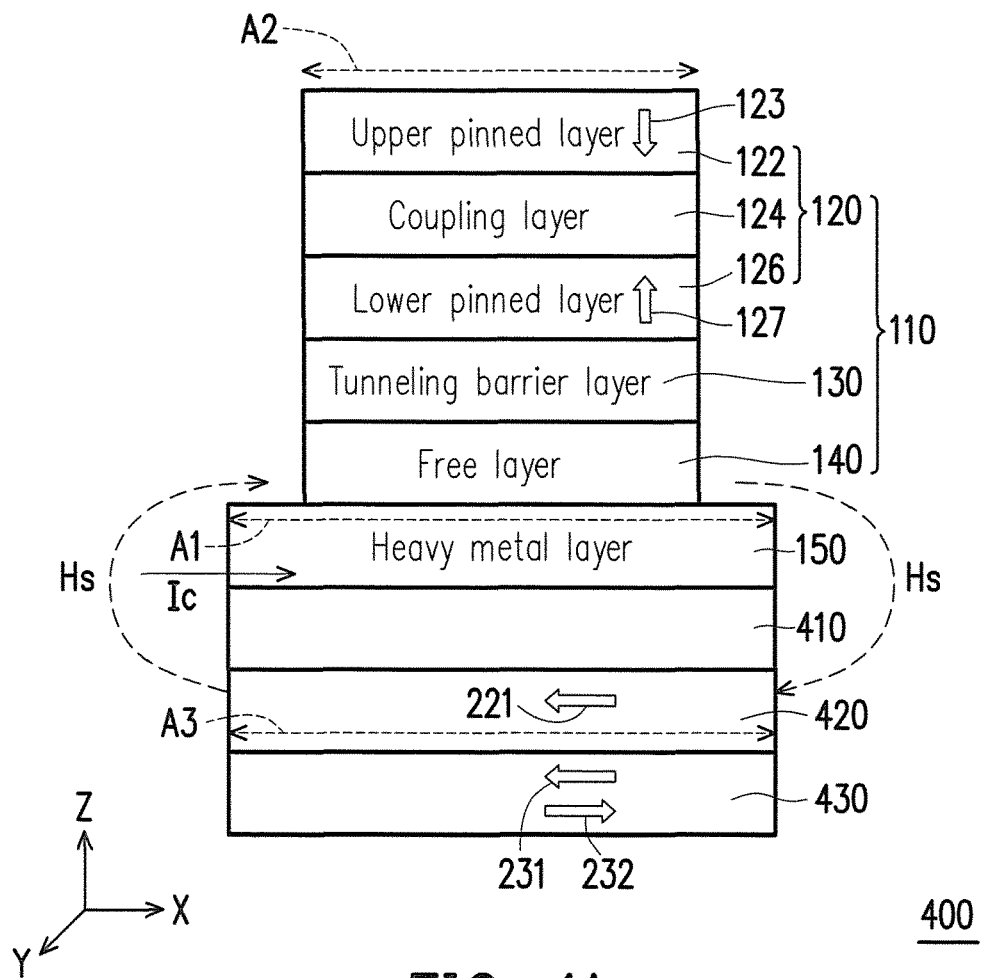
FIG. 4A is a cross-sectional view of a structure of a perpendicularly magnetized spin-orbit magnetic device according to a third embodiment of the disclosure.
Figure 4B:
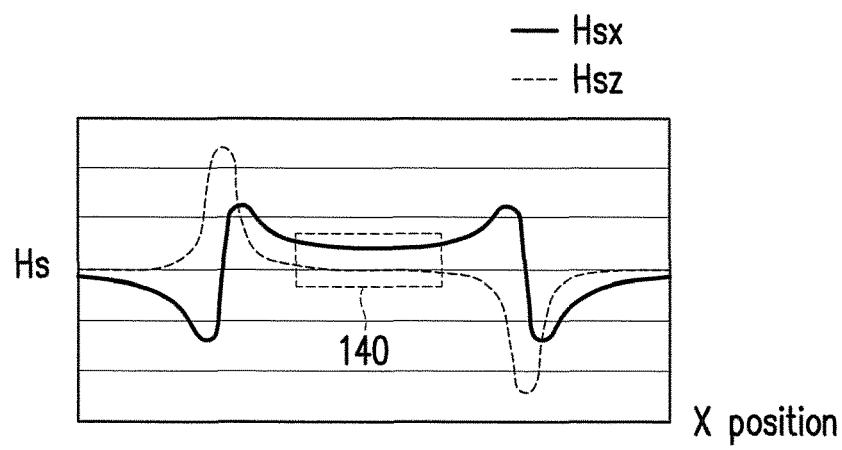
FIG. 4B is a simulation schematic diagram of a stray magnetic field of the perpendicularly magnetized spin-orbit magnetic device of FIG. 4A.

FIG. 4A is a cross-sectional view of a structure of a perpendicularly magnetized spin-orbit magnetic device 400 according to a third embodiment of the disclosure, and FIG. 4B is a simulation schematic diagram of the stray magnetic field Hs of the perpendicularly magnetized spin-orbit magnetic device 400 of FIG. 4A. The first antiferromagnetic layer 430 defines a direction of the magnetic moment in the first stray field applying layer 420 to be parallel to the film plane, as shown by arrows 231 and 232. The direction of the magnetic moment in the first stray field applying layer 420 is indicated by the arrow 221. A difference between FIG. 4A and FIG. 2, FIG. 3 is that the third film plane area A3 of the first antiferromagnetic layer 430 and the first stray field applying layer 420 is equal to the first film plane area A1 of the heavy metal layer 150. A film plane area of the first block layer 410 is A1. Through simulation of the stray magnetic field Hs and FIG. 4B, it is known that the horizontal direction stray magnetic field Hs (a magnetic field Hsx in FIG. 4B) sensed by the whole free layer 140 in FIG. 4B is more average, and a value of the vertical direction stray magnetic field Hs (a magnetic field Hsz in FIG. 4B) is smaller than the simulation of FIG. 2 and FIG. 3. In detail, an average value of the magnetic field Hsx is smaller than the horizontal direction stray magnetic field Hs of the free layer 140 of FIG. 2 and FIG. 3, and is greater than the horizontal direction stray magnetic field Hs of the free layer 140 of FIG. 5. The average value of the magnetic field Hsz is smaller than the vertical direction stray magnetic field Hs of the free layer 140 of FIG. 2 and FIG. 3, and is greater than the vertical direction stray magnetic field Hs of the free layer 140 of FIG. 5.

Figure 5:
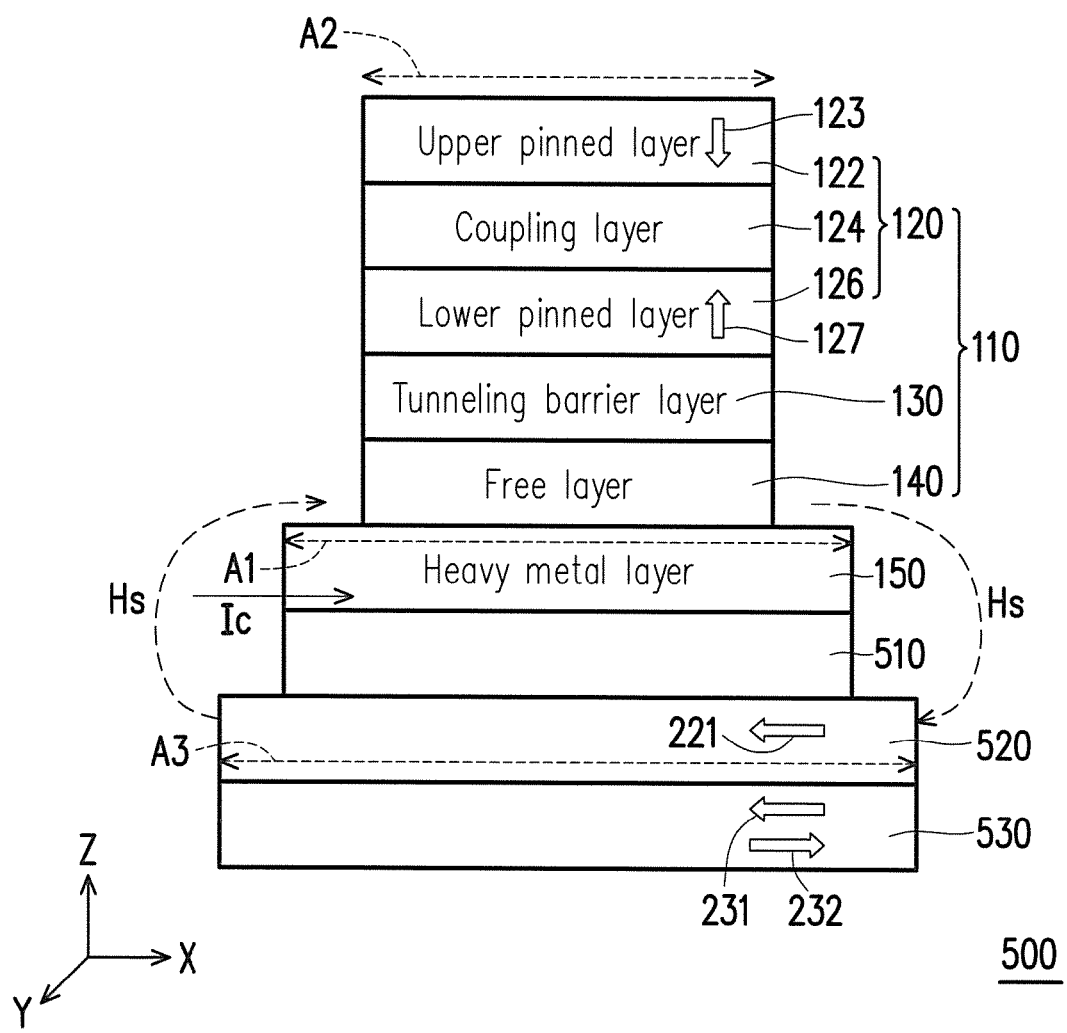
FIG. 5 is a cross-sectional view of a structure of a perpendicularly magnetized spin-orbit magnetic device according to a fourth embodiment of the disclosure.

FIG. 5 is a cross-sectional view of a structure of a perpendicularly magnetized spin-orbit magnetic device 500 according to a fourth embodiment of the disclosure. A difference between FIG. 5 and FIG. 2, FIG. 3, FIG. 4 is that the third film plane area A3 of the first antiferromagnetic layer 530 and the first stray field applying layer 520 is greater than the first film plane area A1 of the heavy metal layer 150. The first block layer 510 has the first film plane area A1. In this way, through simulation of the stray magnetic field Hs, it is known that the horizontal direction stray magnetic field Hs sensed by the whole free layer 140 in FIG. 5 is more average, and a value of the vertical direction stray magnetic field Hs is smaller than the simulation of FIG. 2, FIG. 3 and FIG. 4. In other words, an average value of the horizontal direction stray magnetic field Hs of the free layer 140 of FIG. 5 is smaller than the horizontal direction stray magnetic field Hs of FIG. 2 to FIG. 4, and an average value of the vertical direction stray magnetic field Hs of the free layer 140 of FIG. 5 is also smaller than the horizontal direction stray magnetic field Hs of FIG. 2 to FIG. 4. In this way, based on the simulation of FIG. 2 to FIG. 5, in order to make the free layer 140 to have the even horizontal direction stray magnetic field Hs and avoid obtaining a larger vertical direction stray magnetic field Hs, the film plane area of the first antiferromagnetic layer and the first stray field applying layer is preferably to be greater than or equal to the film plane area of the heavy metal layer.

Figure 6:
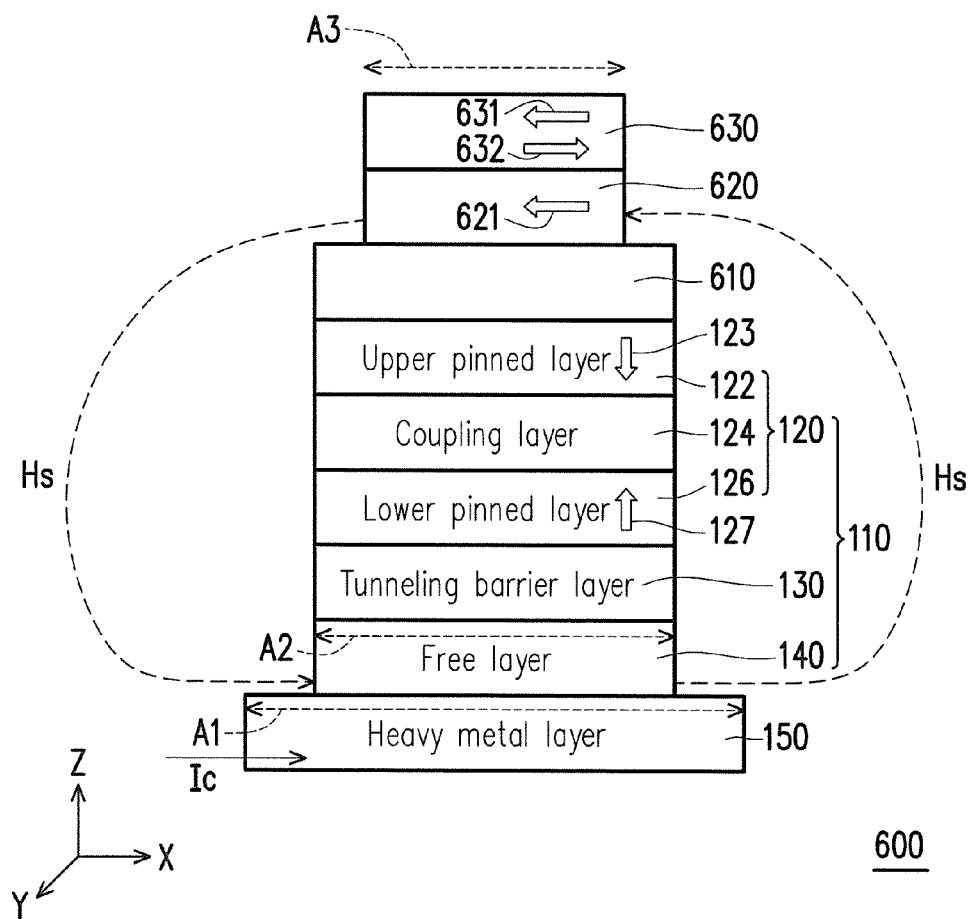
FIG. 6 is a cross-sectional view of a structure of a perpendicularly magnetized spin-orbit magnetic device according to a fifth embodiment of the disclosure.
Figure 7A:
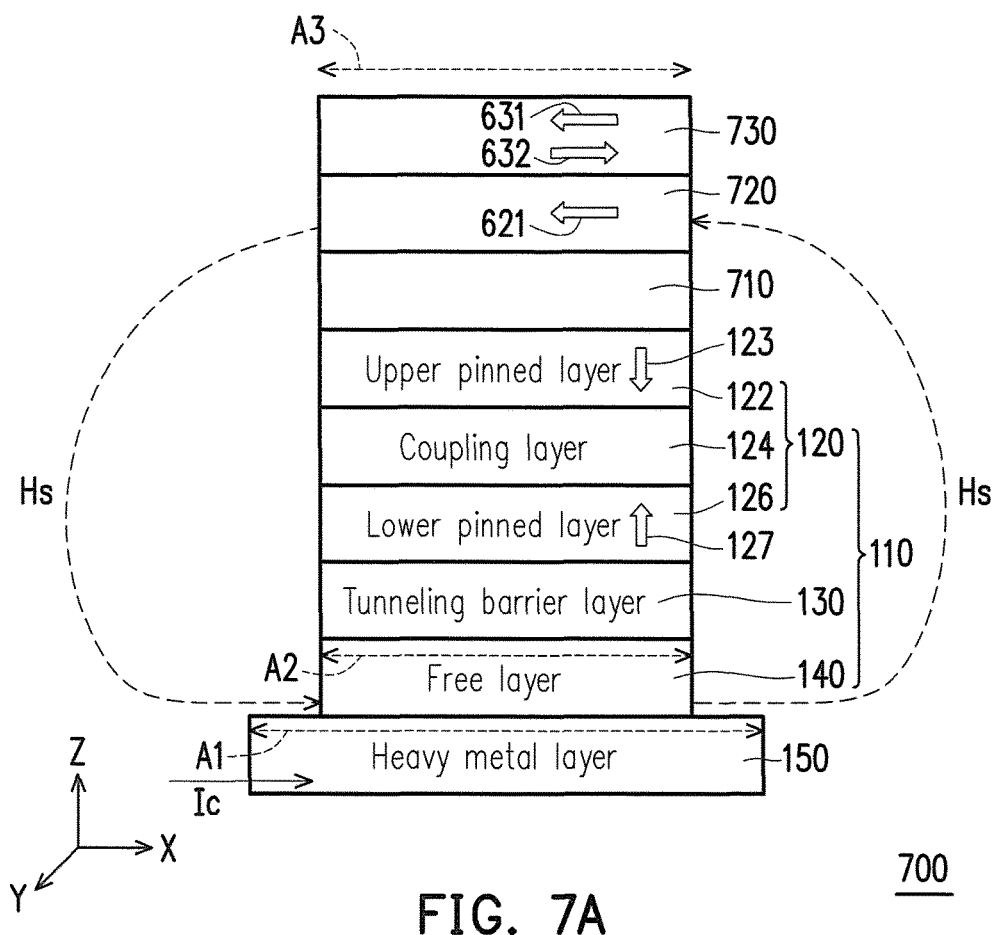
FIG. 7A is a cross-sectional view of a structure of a perpendicularly magnetized spin-orbit magnetic device according to a sixth embodiment of the disclosure.
Figure 7B:
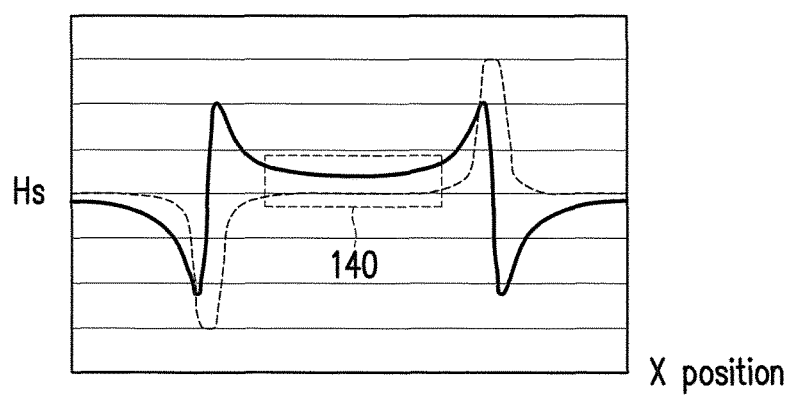
FIG. 7B is a simulation schematic diagram of a stray magnetic field of the perpendicularly magnetized spin-orbit magnetic device of FIG. 7A.
Figure 8:
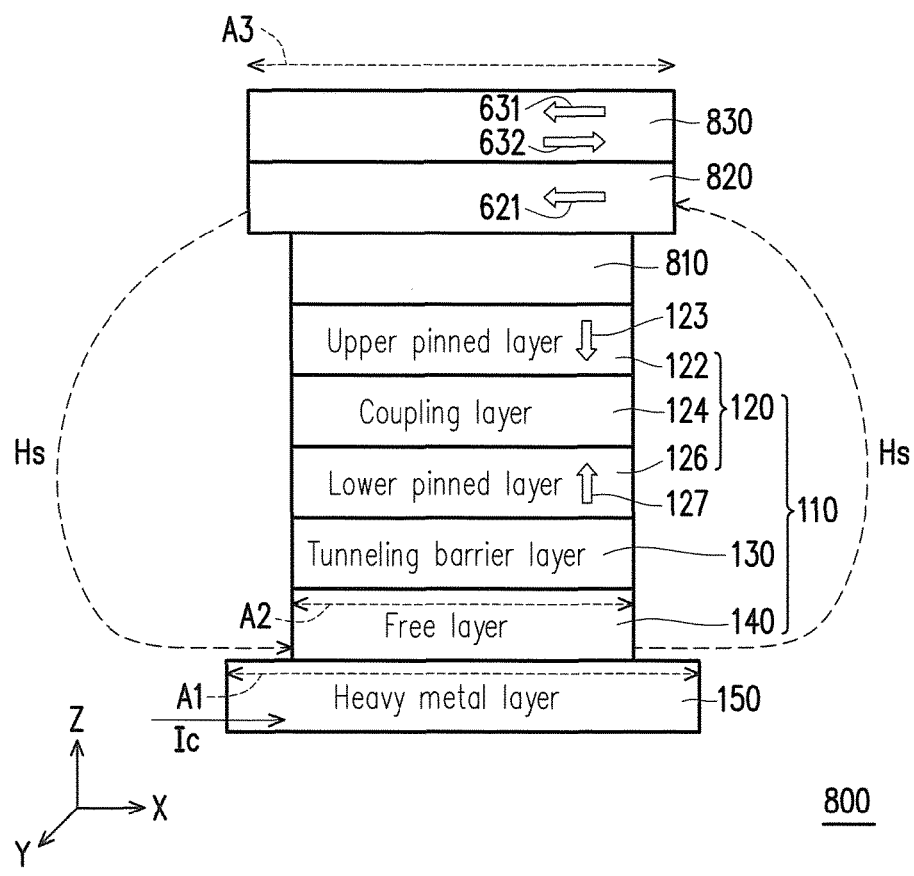
FIG. 8 is a cross-sectional view of a structure of a perpendicularly magnetized spin-orbit magnetic device according to a seventh embodiment of the disclosure.

The first block layer, the first stray field applying layer and the first antiferromagnetic layer can also be disposed above the pinned layer 120 of the magnetic tunnel junction 110, and structures of perpendicularly magnetized spin-orbit magnetic devices 600, 700, 800 of FIG. 6 to FIG. 8 are taken as examples for description. FIG. 6 is a cross-sectional view of a structure of a perpendicularly magnetized spin-orbit magnetic device 600 according to a fifth embodiment of the disclosure. In the present embodiment, the first block layer 610 is disposed on the pinned layer 120 of the magnetic tunnel junction 110. The first stray field applying layer 620 is disposed on the first block layer 610, and the first antiferromagnetic layer 630 is disposed on the first stray field applying layer 620. The first antiferromagnetic layer 630 defines a direction of the magnetic moment in the first stray field applying layer 620 to be parallel to the film plane (i.e. parallel to the XY plane), as shown by arrows 631 and 632. An arrow 621 is used to indicate the direction of the magnetic moment in the first stray field applying layer 620. Since the first stray field applying layer 620 is located away from the heavy metal layer 150, the first block layer 610 is not required to block the spin current in the heavy metal layer 150 from influencing the first stray field applying layer 620. However, the first block layer 610 is still required to block the first antiferromagnetic layer 630 from transferring the magnetic moment arrangement direction of the coupling layer 124 in the pinned layer 120. Functions and materials of the first block layer 610, the first stray field applying layer 620 and the first antiferromagnetic layer 630 are the same as that of the corresponding layers of FIG. 2.

In FIG. 6, the first stray field applying layer 620 and the first antiferromagnetic layer 630 have the same film plane area A3. It is assumed that the first block layer 610 has the second film plane area A2, and the third film plane area A3 of the first stray field applying layer 620 and the first antiferromagnetic layer 630 is smaller than the second film plane area A2 of the free layer 140. Through the simulation of the stray magnetic field Hs, it is known that a magnetic field reception of the free layer 140 of FIG. 6 is similar to the simulation of FIG. 2. In case of a more detailed comparison, the horizontal direction stray magnetic field Hs at the boundary of the free layer 140 of FIG. 2 is slightly greater than the horizontal direction stray magnetic field Hs at the boundary of the free layer 140 of FIG. 6, and the vertical direction stray magnetic field Hs at the boundary of the free layer 140 of FIG. 6 is slightly greater than the vertical direction stray magnetic field Hs at the boundary of the free layer 140 of FIG. 2. Namely, compared with the free layer 140 of FIG. 6, the free layer 140 of FIG. 2 may effectively implement the spin transfer switching effect, and may slightly decrease the influence of the vertical direction stray magnetic field Hs.

FIG. 7A is a cross-sectional view of a structure of a perpendicularly magnetized spin-orbit magnetic device 700 according to a sixth embodiment of the disclosure, and FIG. 7B is a simulation schematic diagram of the stray magnetic field Hs of the perpendicularly magnetized spin-orbit magnetic device 700 of FIG. 7A. The first antiferromagnetic layer 730 defines a direction of the magnetic moment in the first stray field applying layer 720 to be parallel to the film plane, as shown by arrows 631 and 632. The direction of the magnetic moment in the first stray field applying layer 720 is indicated by the arrow 621. A difference between FIG. 6 and FIG. 7A is that the third film plane area A3 of the first antiferromagnetic layer 730 and the first stray field applying layer 720 is equal to the second film plane area A2 of the magnetic tunnel junction 110. The first block layer 710 has the second film plane area A2. The stray magnetic field Hs sensed by the free layer 140 of FIG. 7A may refer to the simulation waveform of FIG. 7B. Through simulations of the stray magnetic field Hs in FIG. 6 to FIG. 8 and FIG. 7B, it is known that the horizontal direction stray magnetic field Hs (a magnetic field Hsx in FIG. 7B) sensed by the whole free layer 140 in FIG. 7B is more average. In detail, the horizontal direction stray magnetic field Hs and the vertical direction stray magnetic field Hs at the boundary of the free layer 140 of FIG. 7B are all greater than the horizontal direction stray magnetic field Hs and the vertical direction stray magnetic field Hs at the boundary of the free layer 140 of FIG. 6, and are smaller than the horizontal direction stray magnetic field Hs and the vertical direction stray magnetic field Hs at the boundary of the free layer 140 of FIG. 8.

FIG. 8 is a cross-sectional view of a structure of a perpendicularly magnetized spin-orbit magnetic device 800 according to a seventh embodiment of the disclosure. The first antiferromagnetic layer 830 defines a direction of the magnetic moment in the first stray field applying layer 820 to be parallel to the film plane, as shown by arrows 631 and 632. The direction of the magnetic moment in the first stray field applying layer 820 is indicated by the arrow 621. A difference between FIG. 6 and FIG. 8 is that the third film plane area A3 of the first antiferromagnetic layer 830 and the first stray field applying layer 820 is greater than the second film plane area A2 of the magnetic tunnel junction 110. The first block layer 810 has the second film plane area A2. Through simulation of the stray magnetic field Hs, it is known that the magnetic field sensed by the free layer 140 of FIG. 8 is similar to the simulation of FIG. 5. Namely, the horizontal direction stray magnetic field Hs sensed by the whole free layer 140 in FIG. 8 is more average and weaker compared to the horizontal direction stray magnetic field Hs of the free layer 140 in FIG. 6, FIG. 7, and the vertical direction stray magnetic field Hs of the free layer 140 in FIG. 8 is relatively less compared to the vertical direction stray magnetic field Hs of the free layer 140 in FIG. 6, FIG. 7. In this way, based on the simulation of the stray magnetic field Hs of FIG. 6 to FIG. 8, in order to make the free layer 140 to have the even horizontal direction stray magnetic field Hs and avoid obtaining a larger vertical direction stray magnetic field Hs, the film plane area of the first antiferromagnetic layer and the first stray field applying layer is preferably to be greater than or equal to the film plane area of the pinned layer 120.

In the embodiment of the disclosure, the block layer, the stray field applying layer and the antiferromagnetic layer can also be disposed under the heavy metal layer 150 and above the pinned layer 120 of FIG. 1, so as to strengthen an intensity of the stray magnetic field in the free layer 140. Even more, if sizes of the upper and lower stray field applying layers are properly adjusted, the vertical direction stray magnetic fields generated by the two stray field applying layers are probably counteracted, so as to decrease a chance of interfering the free layer 140.

Figure 9:
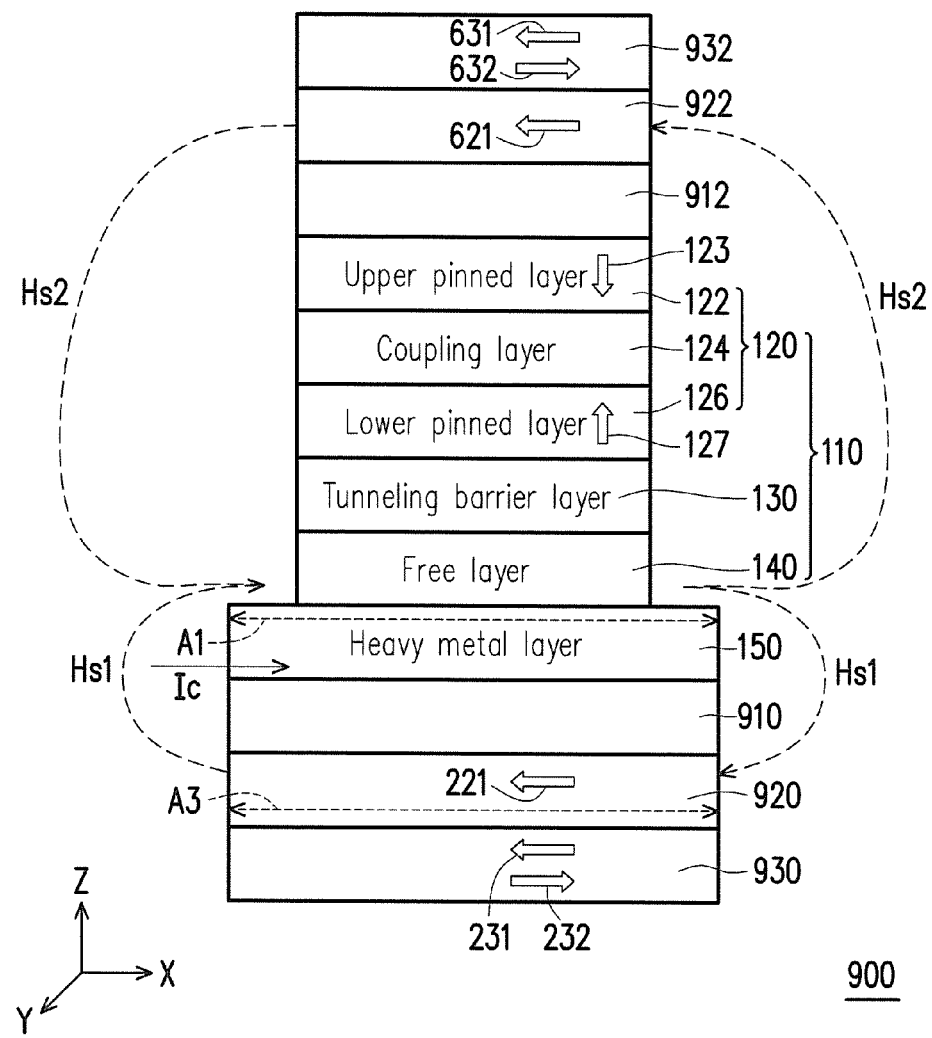
FIG. 9 is a cross-sectional view of a structure of a perpendicularly magnetized spin-orbit magnetic device according to an eighth embodiment of the disclosure.

FIG. 9 is a cross-sectional view of a structure of a perpendicularly magnetized spin-orbit magnetic device 900 according to an eighth embodiment of the disclosure. In FIG. 9, the heavy metal layer 150 is disposed on the first block layer 910, the first block layer 910 is disposed on the first stray field applying layer 920, and the first stray field applying layer 920 is disposed on the first antiferromagnetic layer 930. The first antiferromagnetic layer 930 defines a direction of the magnetic moment in the first stray field applying layer 920 to be parallel to the film plane, as shown by arrows 231 and 232. The direction of the magnetic moment in the first stray field applying layer 920 is indicated by an arrow 221. A second block layer 912 is disposed on the pinned layer 120 of the magnetic tunnel junction 110, a second stray field applying layer 922 is disposed on the second block layer 912, and a second antiferromagnetic layer 932 is disposed on the second stray field applying layer 922. The second antiferromagnetic layer 932 defines a direction of the magnetic moment in the second stray field applying layer 922 to be parallel to the film plane, as shown by arrows 631 and 632. The direction of the magnetic moment in the second stray field applying layer 922 is indicated by an arrow 621. In this way, a magnetic intensity of a horizontal direction stray magnetic field Hs1 generated by the first stray field applying layer 920 is added with a magnetic intensity of a horizontal direction stray magnetic field Hs2 generated by the second stray field applying layer 922 in the horizontal direction, such that the free layer 140 may obtain the strongest intensity of the horizontal direction stray magnetic field Hs sensed by the free layer 140 in FIG. 2 to FIG. 9. Comparatively, since the vertical direction stray magnetic field Hs1 and the vertical direction stray magnetic field Hs2 are opposite to each other, the two vertical direction stray magnetic fields Hs1 and Hs2 are slightly counteracted at the free layer 140 of FIG. 9. Namely, a value of the vertical direction stray magnetic field parallel to the Z-axis direction at the free layer 140 is decreased, so as to decrease a chance of interfering the free layer 140 when the free layer 140 implements the spin transfer switching effect.

Figure 10:
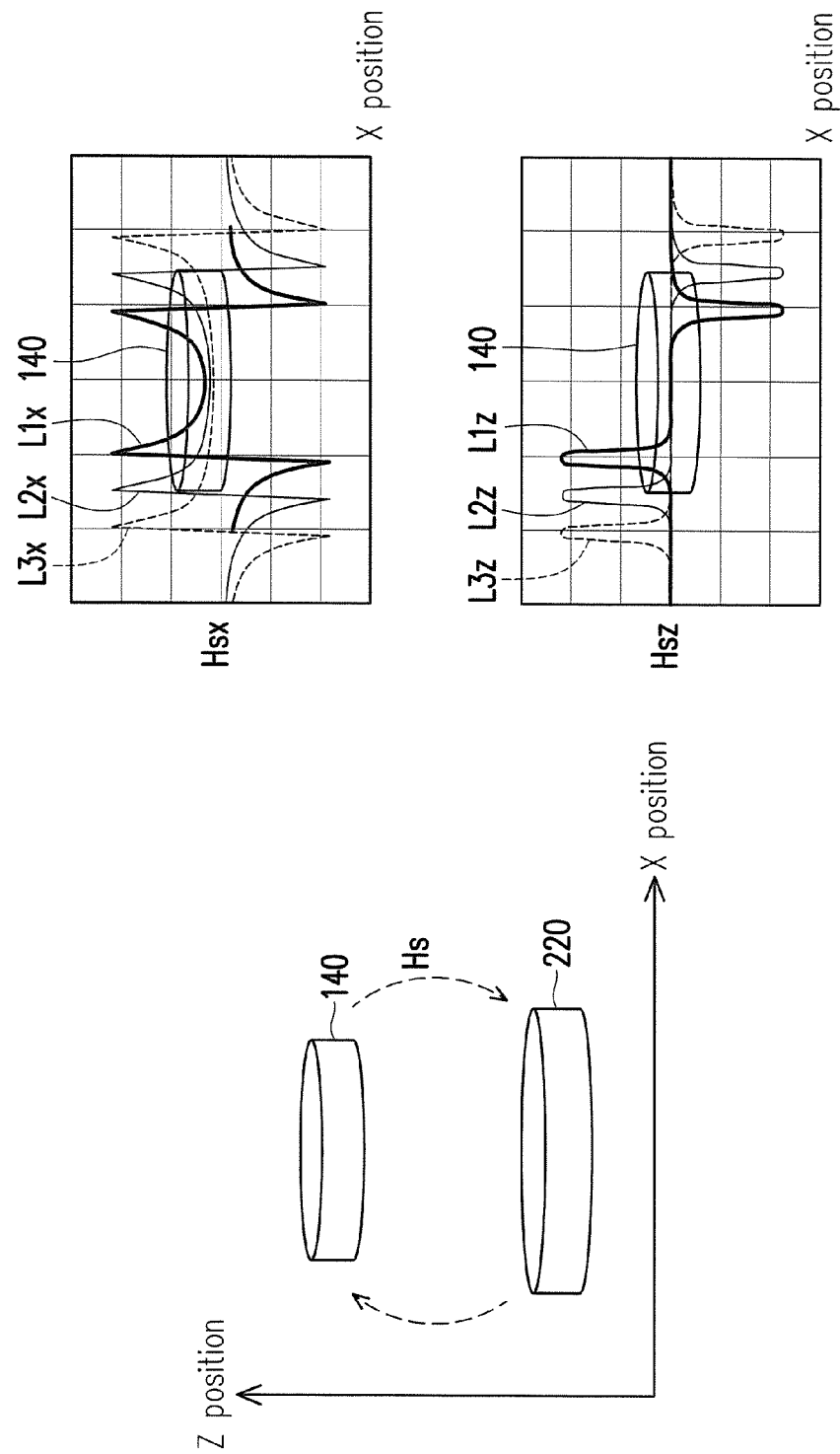
FIG. 10 is a simulation schematic diagram of a free layer and a first stray field applying layer implementing a stray magnetic field according to the second embodiment of the disclosure.

In an embodiment of the disclosure, it is also deeply analysed whether the shape of the stray field applying layer and the shape of the free layer are interfered with each other to influence the stray magnetic field sensed by the free layer. FIG. 10 is a simulation schematic diagram of the free layer 140 and the first stray field applying layer 220 implementing the stray magnetic field Hs according to the second embodiment of the disclosure. For simplicity's sake, only a left part of FIG. 10 illustrates the free layer 140 and the first stray field applying layer 220 located below the heavy metal layer, and an upper right part of FIG. 10 illustrates an intensity simulation diagram of the horizontal direction stray magnetic field Hsx generated by the first stray field applying layer 220, and a lower right part of FIG. 10 illustrates an intensity simulation diagram of the vertical direction stray magnetic field Hsz generated by the first stray field applying layer 220. It is assumed that the shapes of the free layer 140 and the first stray field applying layer 220 are all rounds, a diameter of the free layer 140 is 300 nm, and a distance between the free layer 140 and the first stray field applying layer 220 is 5 nm. In the intensity simulation diagram of the horizontal direction stray magnetic field Hsx, a line L1$x/a$ line L2$x/a$ line L3$x$ respectively represent the horizontal direction stray magnetic fields Hsx generated when the diameter of the first stray field applying layer 220 is respectively 200 nm/300 nm/400 nm. In the intensity simulation diagram of the vertical direction stray magnetic field Hsz, a line L1$z/a$ line L2$z/a$ line L3$z$ respectively represent the vertical direction stray magnetic fields Hsz generated when the diameter of the first stray field applying layer 220 is respectively 200 nm/300 nm/400 nm. According to the simulation diagram of FIG. 10, it is known that the smaller the diameter of the first stray field applying layer 220 is, the larger the horizontal direction stray magnetic field Hsx at the boundary of the free layer 140 is, and the larger the interference of the vertical direction stray magnetic field Hsz is. Comparatively, the larger the diameter of the first stray field applying layer 220 is, the smaller the horizontal direction stray magnetic field Hsx at the boundary of the free layer 140 is, and the smaller the interference of the vertical direction stray magnetic field Hsz is.

Figure 11:
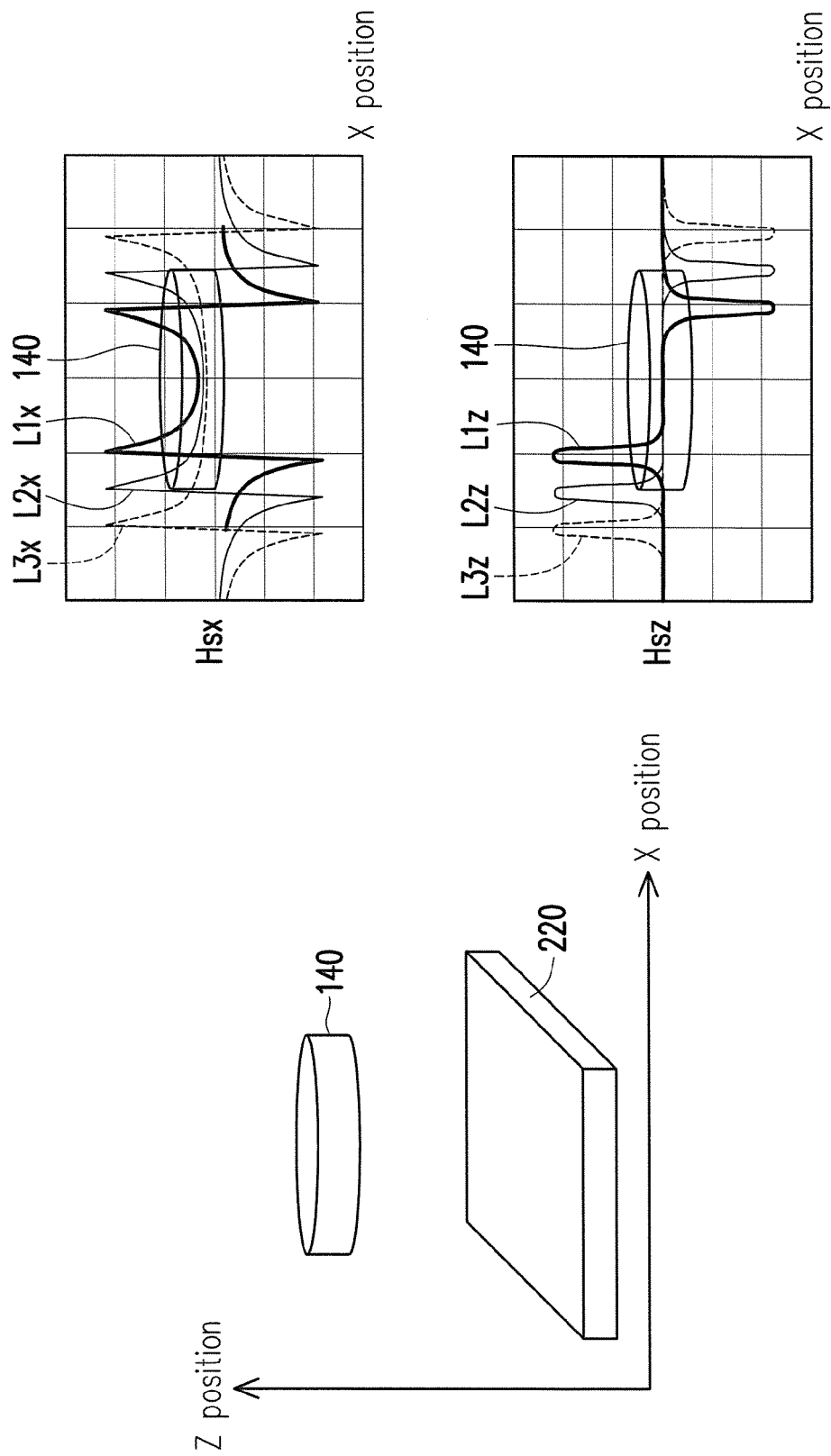
FIG. 11 is another simulation schematic diagram of a free layer and a first stray field applying layer implementing a stray magnetic field according to the second embodiment of the disclosure.

FIG. 11 is another simulation schematic diagram of the free layer 140 and the first stray field applying layer 220 implementing the stray magnetic field Hs according to the second embodiment of the disclosure. Similar to FIG. 10, only a left part of FIG. 11 illustrates the free layer 140 and the first stray field applying layer 220 located below the heavy metal layer, and an upper right part and a lower right part of FIG. 11 respectively illustrate an intensity simulation diagram of the horizontal direction stray magnetic field Hsx and an intensity simulation diagram of the vertical direction stray magnetic field Hsz generated by the first stray field applying layer 220. A difference between FIG. 10 and FIG. 11 is that the shape of the free layer 140 is a round, though the shape of the first stray field applying layer 220 is a square. In the intensity simulation diagram of the horizontal direction stray magnetic field Hsx, a line L1$x/a$ line L2$x/a$ line L3$x$ respectively represent the horizontal direction stray magnetic fields Hsx generated when a side length of the first stray field applying layer 220 is respectively 200 nm/300 nm/400 nm. In the intensity simulation diagram of the vertical direction stray magnetic field Hsz, a line L1$z/a$ line L2$z/a$ line L3$z$ respectively represent the vertical direction stray magnetic fields Hsz generated when the side length of the first stray field applying layer 220 is respectively 200 nm/300 nm/400 nm. Similar to FIG. 10, according to the simulation diagram of FIG. 11, it is known that the smaller the side length of the first stray field applying layer 220 is, the larger the horizontal direction stray magnetic field Hsx at the boundary of the free layer 140 is, and the larger the interference of the vertical direction stray magnetic field Hsz is. Comparatively, the larger the side length of the first stray field applying layer 220 is, the smaller the horizontal direction stray magnetic field Hsx at the boundary of the free layer 140 is, and the smaller the interference of the vertical direction stray magnetic field Hsz is.

In summary, the perpendicularly magnetized spin-orbit magnetic device provided by the embodiments of the disclosure may spontaneously produce a stray closed magnetic circle to the free layer in the magnetic tunnel junction to provide the stray magnetic field through the antiferromagnetic layer, the block layer and the stray field applying layer, so as to provide a switching effect to a magnetic moment in the memory cell structure when an input current is input as that does of an external magnetic field. In this way, operation complexity of the perpendicularly magnetized spin-orbit magnetic device is simplified. Since the perpendicularly magnetized spin-orbit magnetic device itself may produce the stray magnetic field without using the external magnetic field, and magnetic moment switching of the free layer of the magnetic tunnel junction in the perpendicularly magnetized spin-orbit magnetic device can be implemented only by introducing the input current, the design complexity of the operation mechanism used for controlling the perpendicularly magnetized spin-orbit magnetic device can be greatly simplified.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. A perpendicularly magnetized spin-orbit magnetic device, comprising:
a heavy metal layer;
a magnetic tunnel junction, disposed on the heavy metal layer;
a first antiferromagnetic layer;
a first block layer, disposed between the magnetic tunnel junction and the first antiferromagnetic layer; and
a first stray field applying layer, disposed between the first antiferromagnetic layer and the first block layer, and providing a stray magnetic field parallel to a film plane,
wherein the heavy metal layer is disposed on the first block layer, and the first block layer is disposed on the first stray field applying layer,
wherein the heavy metal layer and the first block layer have a same first film plane area, and the magnetic tunnel junction has a second film plane area, wherein the first film plane area is greater than the second film plane area,
wherein the first antiferromagnetic layer contacts the first stray field applying layer to define a direction of a magnetic moment in the first stray field applying layer.

2. The perpendicularly magnetized spin-orbit magnetic device as claimed in claim 1, wherein the first stray field applying layer and the first antiferromagnetic layer have a same third film plane area, wherein the third film plane area is equal to the first film plane area.

3. The perpendicularly magnetized spin-orbit magnetic device as claimed in claim 1, wherein a material of the first block layer is magnesium oxide, aluminium oxide, magnesium, or a combination thereof.

4. The perpendicularly magnetized spin-orbit magnetic device as claimed in claim 1, wherein the first antiferromagnetic layer is processed with a field annealing treatment of a predetermined temperature to fix the direction of the magnetic moment in the first stray field applying layer, the first antiferromagnetic layer is composed of an antiferromagnetic material, and the antiferromagnetic material is platinum-manganese alloy, magnesium oxide, iridium-manganese alloy, chromium oxide, or a combination thereof.

5. The perpendicularly magnetized spin-orbit magnetic device as claimed in claim 1, wherein the heavy metal layer receives an input current from an electrode contact to generate a spin current, so as to make the magnetic tunnel junction to implement magnetic switching, and a material of the heavy metal layer is tantalum, platinum, tungsten, or a combination thereof.

6. The perpendicularly magnetized spin-orbit magnetic device as claimed in claim 1, wherein the magnetic tunnel junction comprises:
 a free layer;
 a tunneling barrier layer, disposed on the free layer; and
 a pinned layer, disposed on the tunneling barrier layer.

7. The perpendicularly magnetized spin-orbit magnetic device as claimed in claim 6, wherein a material of the free layer is a ferromagnetic material with perpendicular anisotropy, and a magnetic moment vector of the free layer is arranged by perpendicular to the film plane.

8. The perpendicularly magnetized spin-orbit magnetic device as claimed in claim 6, wherein the free layer is a composite structure formed by multi-layer ferromagnetic materials.

9. The perpendicularly magnetized spin-orbit magnetic device as claimed in claim 6, wherein the tunneling barrier layer is magnesium oxide, aluminium oxide, magnesium, or a combination thereof.

10. The perpendicularly magnetized spin-orbit magnetic device as claimed in claim 1, wherein a shape of the magnetic tunnel junction is a round or an oval, and shapes of the first antiferromagnetic layer, the first block layer and the first stray field applying layer are rectangles.

\* \* \* \* \*